United States Patent
Batra et al.

[11] Patent Number: 6,066,517
[45] Date of Patent: *May 23, 2000

[54] METHOD FOR FORMING A THIN FILM TRANSISTOR

[75] Inventors: Shubneesh Batra, Boise; Monte Manning, Kuna; Todd R. Abbott, Namp, all of Id.

[73] Assignee: Micron Technology, Inc., Boise, Id.

[*] Notice: This patent is subject to a terminal disclaimer.

[21] Appl. No.: 09/124,171

[22] Filed: Jul. 28, 1998

Related U.S. Application Data

[63] Continuation of application No. 08/723,945, Sep. 26, 1996, Pat. No. 5,869,360.

[51] Int. Cl.$^7$ .................................................... H01L 21/84
[52] U.S. Cl. ........................ 438/158; 438/970; 438/151
[58] Field of Search ................................... 438/151–166, 438/970

[56] References Cited

U.S. PATENT DOCUMENTS

| | | | |
|---|---|---|---|
| 5,166,084 | 11/1992 | Pfiester | 438/151 |
| 5,350,698 | 9/1994 | Huang et al. | 438/592 |
| 5,366,909 | 11/1994 | Song et al. | 438/163 |
| 5,403,755 | 4/1995 | Chae | 438/151 |
| 5,510,278 | 4/1996 | Nguyen et al. | 438/158 |
| 5,670,399 | 9/1997 | Manning et al. | 438/158 |

OTHER PUBLICATIONS

"Field–Induction–Drain (FID) Poly–Si TFTs with High On/Off Current Ratio," Keiji Tanaka, Kenji Nakazawa, Shiro Suyama, Kinya Kato, Extended Abstracts of the 22nd (1990 International) Conference on Solid State Devices and Materials, Sendai, 1990, pp. 1011–1014.

"Leakage Currents Reduction of Poly–Si TFT's by Two Step Annealing," T. Aoyama, Y. Mochizuki, G. Kawachi, S. Oikawa, and K. Miyata, Extended Abstracts of the 22nd (1990 International) Conference on Solid State Devices and Materials, Sendai, 1990, pp. 389–392.

"High–definition displays and technology trends in TFT–LCDs," I–Wei Wu, Journal of the SID, 2/1, 1994.

*Primary Examiner*—Richard Booth
*Attorney, Agent, or Firm*—Wells, St. John, Roberts, Gregory & Matkin P.S.

[57] ABSTRACT

A method for forming a field effect transistor which includes providing a substrate having thin film source and drain regions formed thereon; forming a thin film channel region intermediate the thin film source and drain regions, the thin film channel region comprising a first layer of semiconductor material, an etch stop layer formed over the first layer semiconductor material, and a second layer of material formed over the etch stop layer; forming a masking layer over the source and drain regions while leaving the thin film channel region effectively exposed; and removing a portion of the second layer of material selectively relative to the etch stop layer in the exposed thin film channel region.

9 Claims, 6 Drawing Sheets

6,066,517

METHOD FOR FORMING A THIN FILM TRANSISTOR

RELATED PATENT DATA

This application is a continuation application of application Ser. No. 08/723,945, which was filed Sep. 26, 1996, now U.S. Pat. No. 5,869,360.

TECHNICAL FIELD

This invention relates generally to the fabrication of thin film field effect transistors have substantially continuous source and drain regions.

BACKGROUND OF THE INVENTION

As circuit density continues to increase, there is a corresponding drive to produce smaller and smaller field effect transistors. Field effect transistors have typically been formed by providing active areas within a bulk substrate material or within a complementary conductivity type well formed within a bulk substrate. One additional technique finding greater application in achieving higher circuit density is to form field effect transistors with thin films, which are stacked and integrated on top of a substrate containing conventional field effect transistors. This is commonly referred to as "thin film transistor" (TFT) technology. These transistors are formed using thin layers which constitute all or a part of the resultant source and drain regions.

Specifically, typical prior art TFT's are formed from a thin film of semiconductive material (typically polysilicon). A central channel region of the thin film is masked by a separate layer, while opposing adjacent source/drain regions are formed with an appropriate p or n type conductivity enhancing impurity. A gate insulator and gate are provided either above or below the thin film channel region, thus providing a field effect transistor having active and channel regions formed within a thin film as opposed to a bulk substrate.

One common material utilized as the thin source, channel and drain film in a TFT is polysilicon. Such is comprised of multiple forms of individual single crystal silicon grains. The locations where two individual crystalline grains abut one another is commonly referred to as a grain boundary. Grain boundaries are inherent in polycrystauline materials, such as polysilicon. The crystalline structure breaks down at the grain boundaries, giving rise to a high concentration of broken or "dangling" Si bonds. These dangling bonds "trap" carriers and give rise to potential barriers at the grain boundaries. These potential barriers impede the flow of carriers in polysilicon, thus reducing conductivity. The grain boundary potential barrier height is proportional to the square of the dangling bond density, or "trap density". Therefore, the smaller the grain size, the higher the trap density and thus the lower the conductance. Conversely, a larger grain size results in a higher conductance.

In a TFT, the grain boundary potential barrier height is modulated by the gate voltage, and hence the conductivity is a function of the gate voltage, as opposed to a resistor, where the barrier height is not modulated. Also, in terms of transistor switching characteristics a larger trap concentration makes it harder for the gate to form a channel resulting in a higher threshold voltage and a lower drive current as compared to bulk transistors. The grain boundary trap concentration also affects the leakage current in TFTs. In polysilicon or other polycrystalline TFTs, the grain boundary traps at the drain end can dramatically increase the leakage current in the presence of a "gate-to-drain" electric field. The increase in leakage results from either "thermionic field emission" and/or "Poole-Frenkel" emission through the grain boundary traps. Accordingly, the greater the number of grain boundaries (i.e., the smaller the grain size), the greater the current leakage through the material. Greater current leakage means that more power is required to replace the leaking current to maintain an SRAM cell transistor or a pixel in a flat panel display in its desired state. Such leakage is particularly adverse in laptop computers, where desired power consumption when a cell's state is not being changed would be desired to be very low to extend battery life.

Therefore, it would be desirable to provide a thin film field effect transistor which is operable to obtain the individual benefits to be derived from related prior art manufacturing processes and practices while avoiding the detriments individually associated therewith.

SUMMARY OF THE INVENTION

The present invention relates to a method for forming a thin film transistor which reduces stand by power consumption in applications such as flat panel displays, various SRAM applications and the like.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
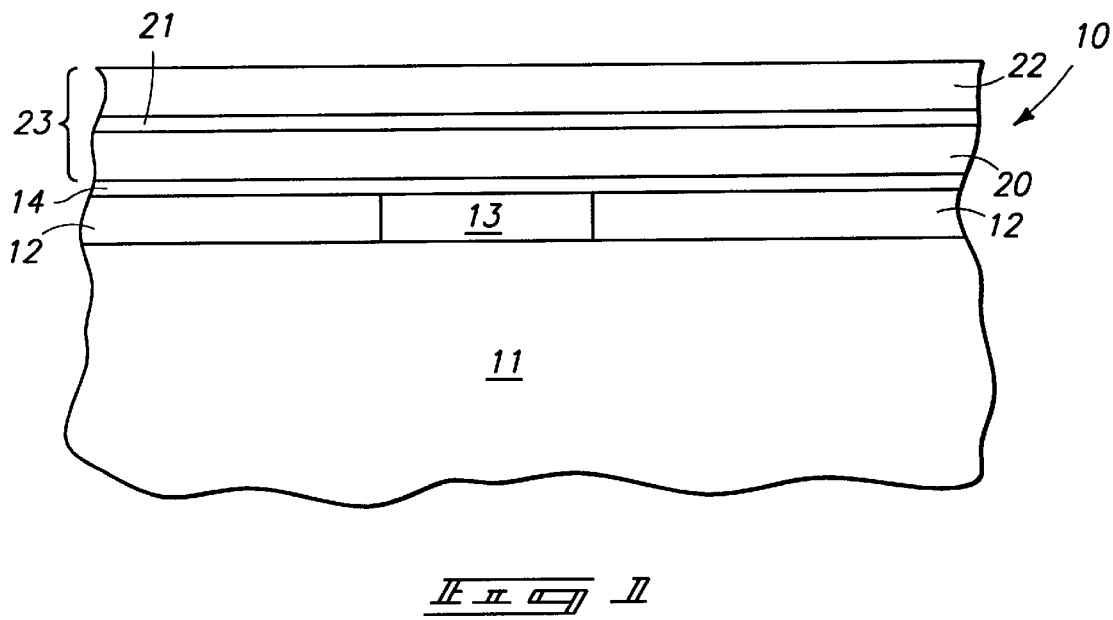
FIG. 1 is a cross sectional view of a first embodiment of a semiconductor wafer fragment at one processing step in accordance with the teachings of the present invention.

Referring first to FIG. 1, a first or bottom gated embodiment of the invention 10 is shown. The first embodiment 10 is comprised of a semiconductor substrate 11 in process upon which an insulating oxide layer 12 is formed. A patterned gate 13 is formed atop the semiconductor substrate 11 within oxide layer 12. A gate dielectric layer 14 is deposited or otherwise formed atop the patterned gate 13 and insulating layer 12. A first layer 20 of a semiconductor material, which preferably comprises polysilicon, is deposited, for example, to a thickness of about 250 Angstroms atop the gate layer 14. An etch stop layer 21 (preferably undoped $SiO_2$, nitride, TiN, W, Ti and others) is then deposited, for example, to a thickness of from about 20 to 30 Angstroms atop the first layer of polysilicon 20. As will be recognized the etch stop layer may be electrically insulative, conductive, or semiconductive. A second layer of material 22, which preferably also comprises a semiconductor material such as polysilicon, is deposited atop the etch stop layer 21 to an example thickness of about 250 Angstroms. The first layer of polysilicon 20, etch stop layer 21, and the second layer of polysilicon 22 form a composite thin film transistor layer 23.

Figure 2:
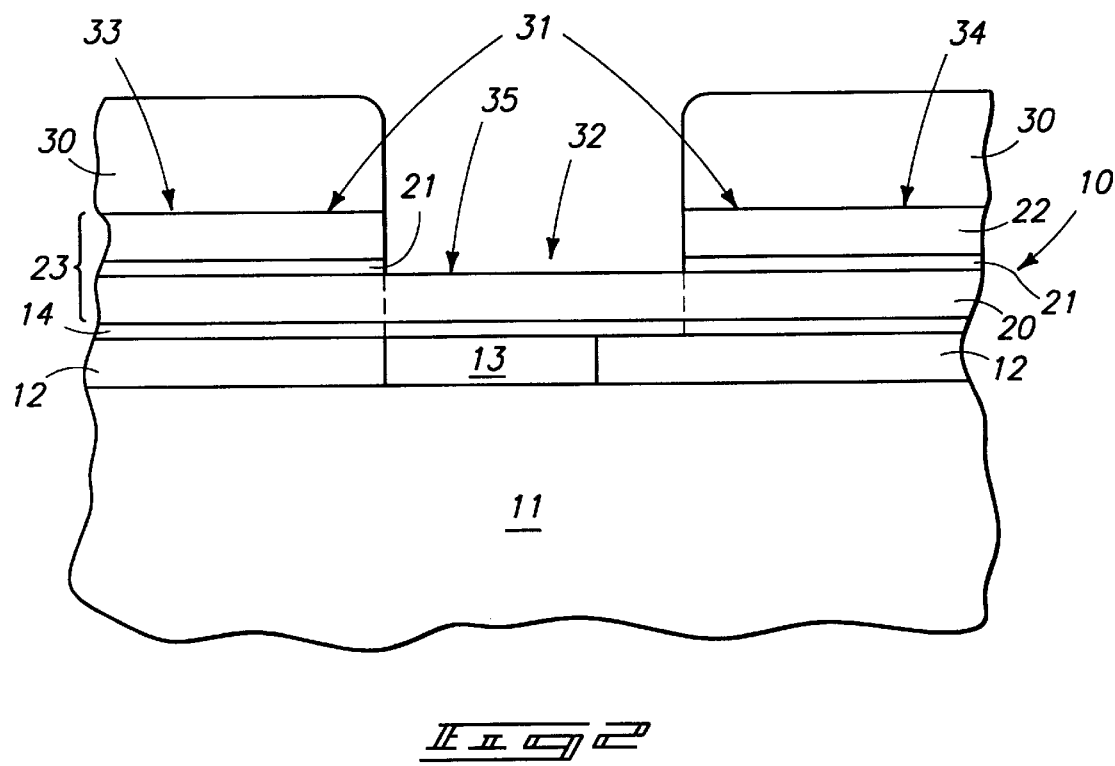
FIG. 2 is a cross sectional view of the FIG. 1 wafer at a processing step subsequent to that shown by FIG. 1.
Figure 2A:
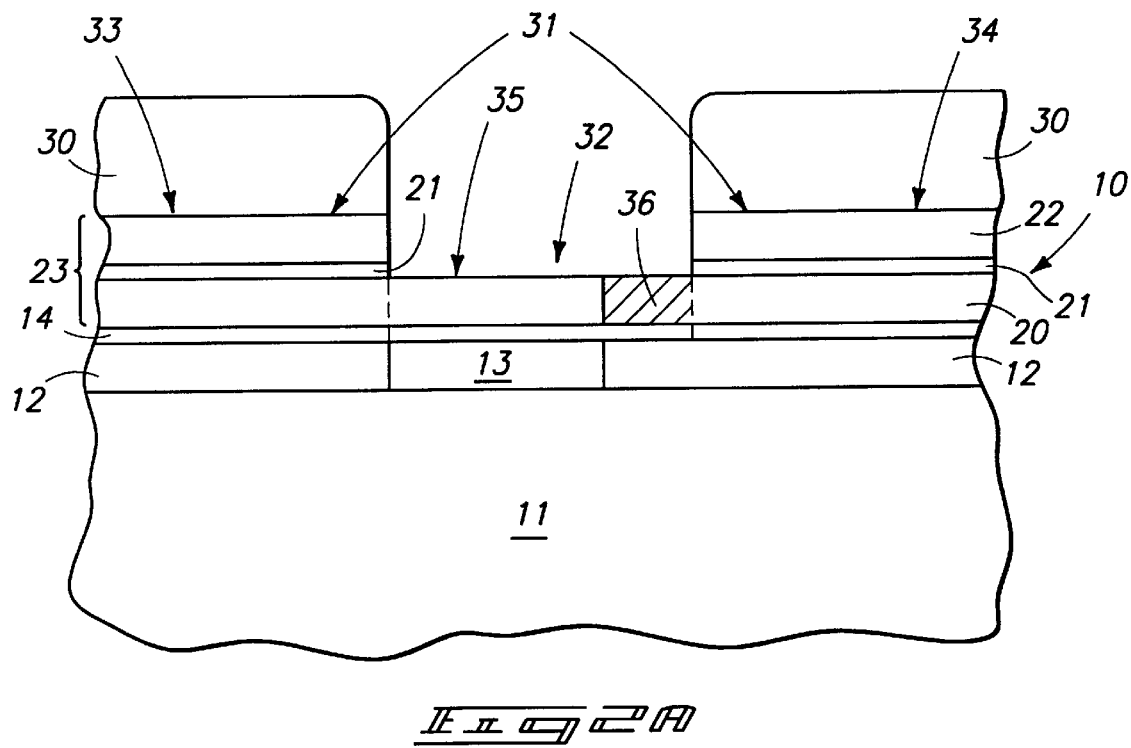
FIG. 2A is a cross sectional view of the FIG. 1 wafer at an optional processing step subsequent to FIG. 1.

Referring now to FIG. 2, a first masking layer 30 is formed atop the second layer of polysilicon 22 to define a masked region 31 and an unmasked region 32 of the thin film transistor layer 23. The masked region comprises a source region 33, and a drain region 34. An intermediate channel region 35 is unmasked. A portion of the second layer of polysilicon is removed in the unmasked region 32, by means of etching. The etching is selective relative to the etch stop layer 21. Optionally, a masking step followed by an implant can be conducted to dope the offset region 36, as shown in FIG. 2A. The offset region 36 is formed regardless of the implant step.

Removal of the etch stop layer over the channel region may now occur if necessary. In those cases where silicon dioxide and silicon nitride are involved, a wet etch chemistry would be effective. An effective chemistry would include a 10:1 HF etch. Other etching chemistries would work with equal success. Removal of the etch stop layer is not necessary if the etch stop layer is electrically insulative or semiconductive, or the thin film transistor layer is bottom gated. On the other hand, if the etch stop layer is electrically conductive this step should ideally occur.

Figure 3:
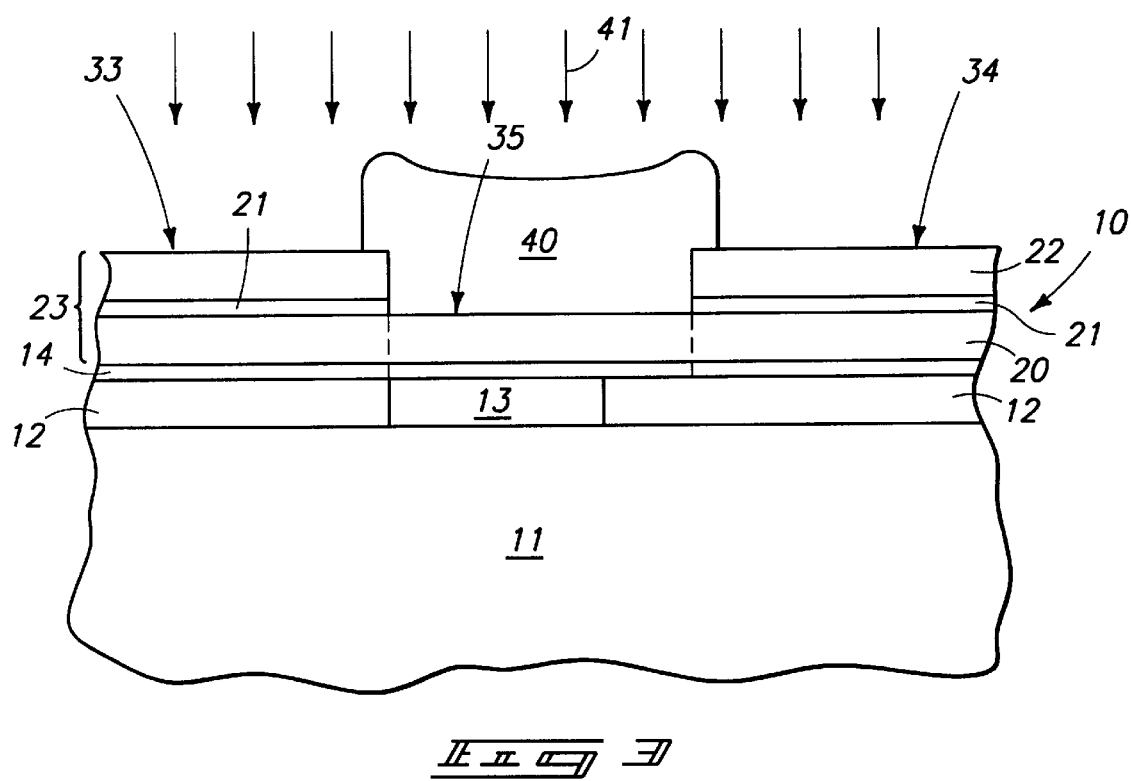
FIG. 3 is a cross sectional view of the FIG. 1 wafer taken at a processing step subsequent to that shown in FIG. 2.
Figure 4:
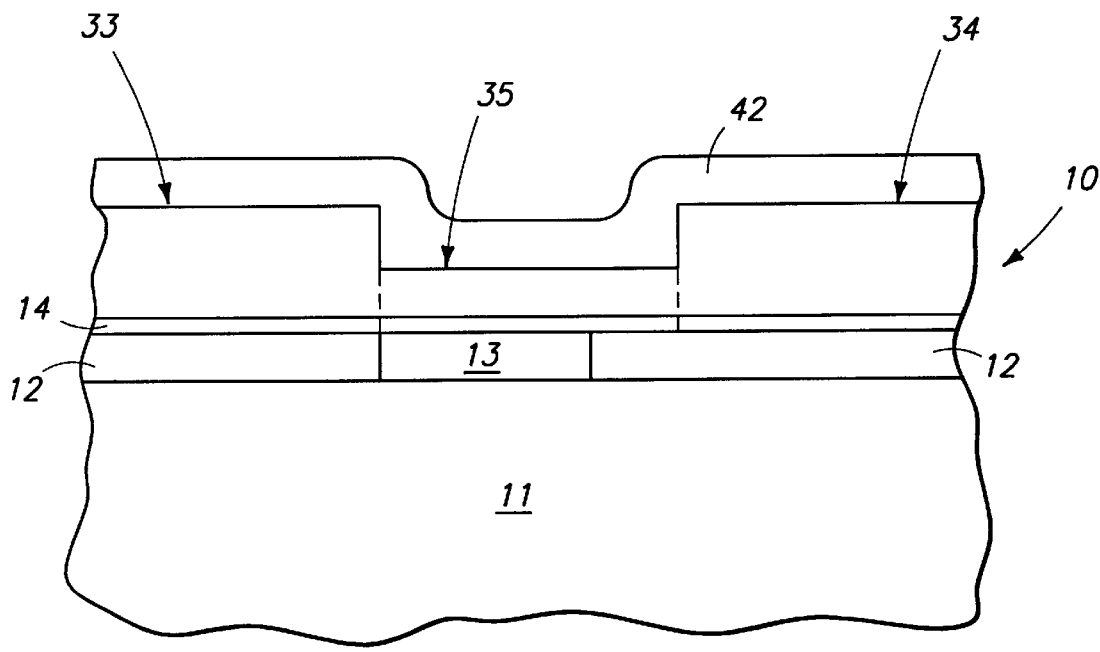
FIG. 4 is a cross sectional view of the FIG. 1 wafer taken at a processing step subsequent to that shown by FIG. 3.

Referring now to FIG. 3, a second masking layer 40 is formed over the channel region 35 while leaving the source and drain regions 33 and 34 effectively exposed. Thereafter, ion implanting represented by arrows 41 is conducted which is effective to both, a) conductively dope the source and drain regions 33 and 34, and b) disperse the etch stop layer 21 within the source and drain regions. A high temperature anneal may also be used to disperse the silicon dioxide into the adjacent polysilicon layers. This is shown in FIG. 4. An electrically insulating layer, such as $SiO_2$ deposited by decomposition of TEOS, is formed atop the underlying source, drain and channel regions 33, 34 and 35 and before further processing.

Figure 5:
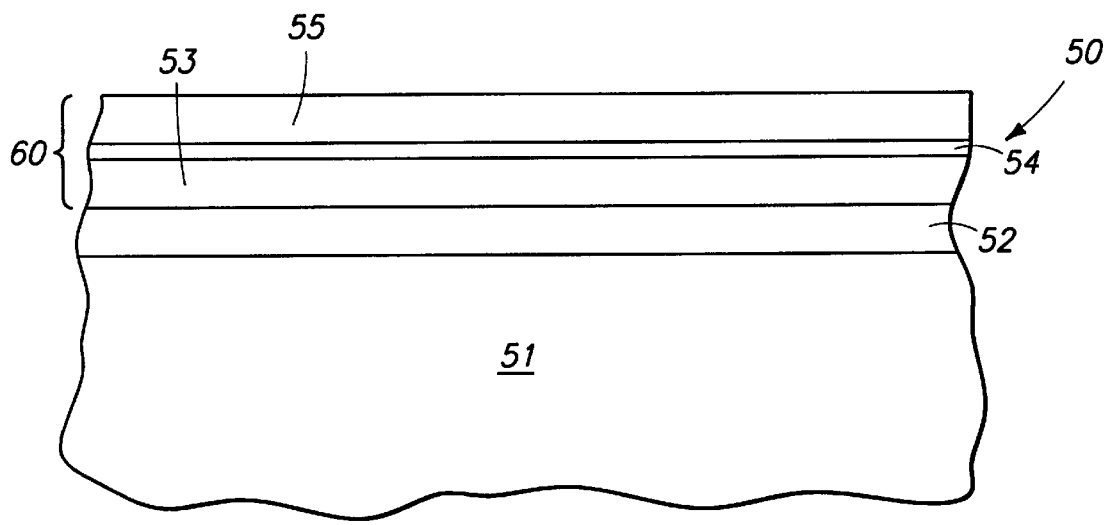
FIG. 5 is a cross sectional view of a second embodiment of a wafer fragment at one processing step in accordance with the teachings of the present invention.

Referring now to FIG. 5, a second or top gated embodiment 50 of the present invention is shown and which comprises a semiconductor substrate fragment 51 in process. An insulating dielectric layer comprising silicon dioxide 52 is formed to a given thickness atop the semiconductor substrate 51. A first polysilicon layer 53 is deposited or otherwise formed to a thickness, for example, of about 250 Angstroms atop the insulating dielectric layer 52. Further, an etch stop layer 54 preferably comprising silicon dioxide is formed atop the first layer of polysilicon 53. The etch stop layer 54 has a preferred thickness, for example, of about 20 to about 30 Angstroms. Further, a second layer of material 55, which preferably comprises polysilicon, is deposited to a thickness, for example, of about 250 Angstroms atop the etch stop layer 54. The first and second polysilicon layers 52 and 55, and the etch stop layer 54 form a composite thin film transistor layer 60.

Figure 6:
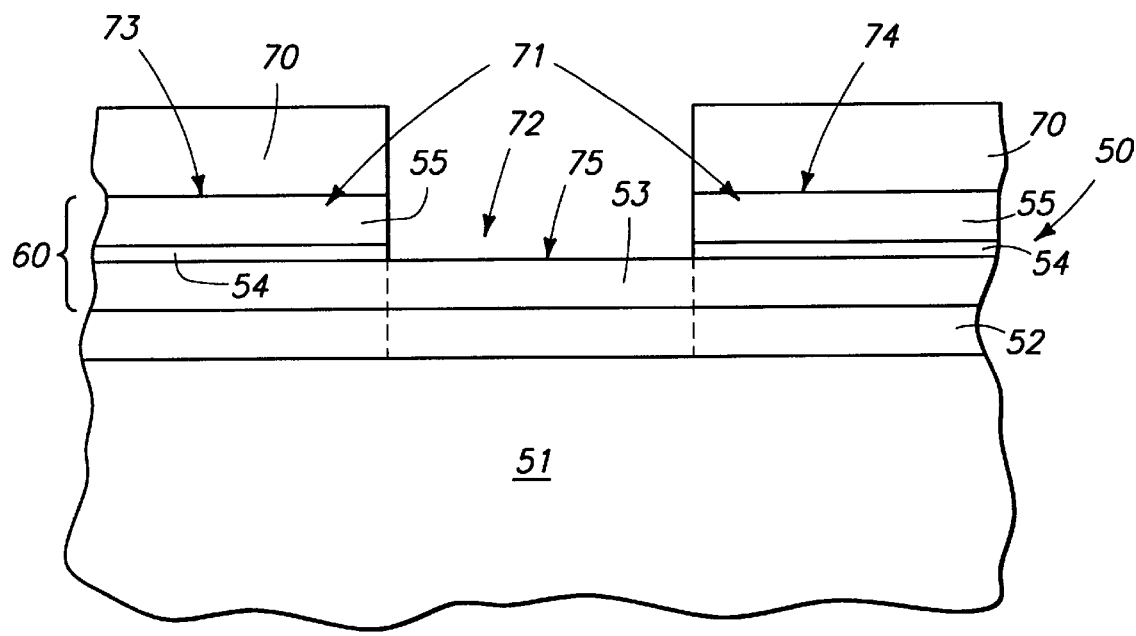
FIG. 6 is a cross sectional view of the FIG. 5 wafer taken at a processing step subsequent to that shown in FIG. 5.

As best seen by reference to FIG. 6, a first masking layer 70 is formed. The masking layer 70 defines a masked region 71 and an unmasked region 72. Further, the masking layer 70 defines a masked source region 73; a masked drain region 74; and an unmasked intermediate channel region 75. Removing the unmasked second layer of semiconductor material 55, by means of etching, is conducted selectively relative to the etch stop layer 54.

Figure 7:
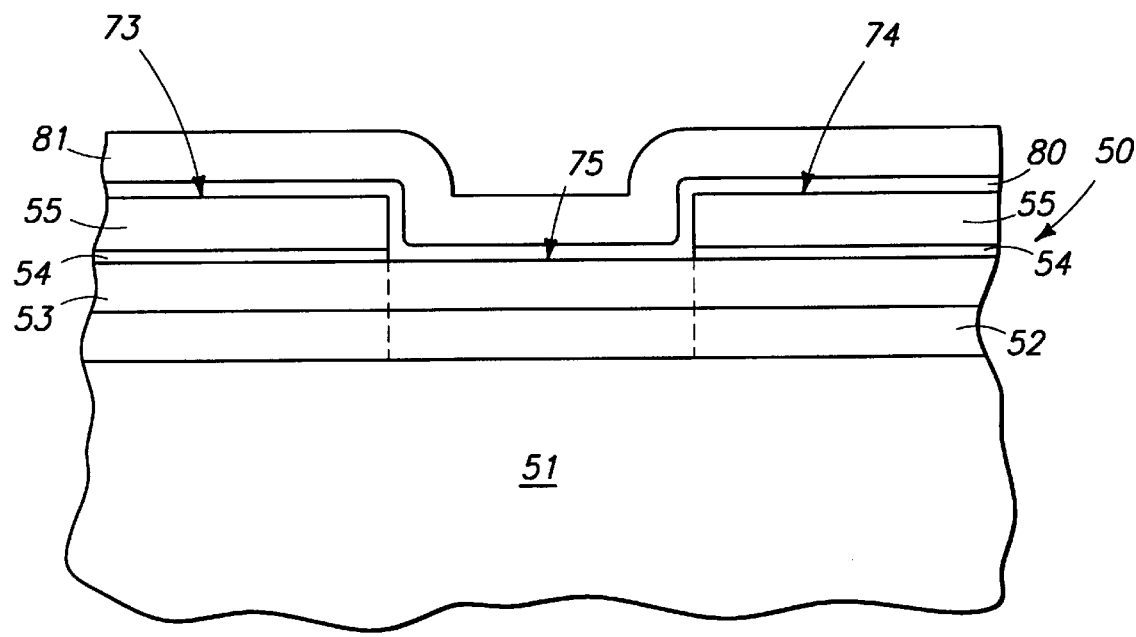
FIG. 7 is a cross sectional view of the FIG. 5 wafer taken at a processing step subsequent to that shown in FIG. 6.

Referring now to FIG. 7, after removing the etch stop layer, the method further comprises forming a gate dielectric layer 80 to a thickness, for example, of about 200 Angstroms atop the thin film channel region 75. As earlier discussed the removal of the etch stop layer may not be required under some circumstances. A gate layer 81 is next provided to a thickness, for example, of about 3,000 Angstroms atop the gate dielectric layer. The gate layer preferably comprises polysilicon.

Figure 8:
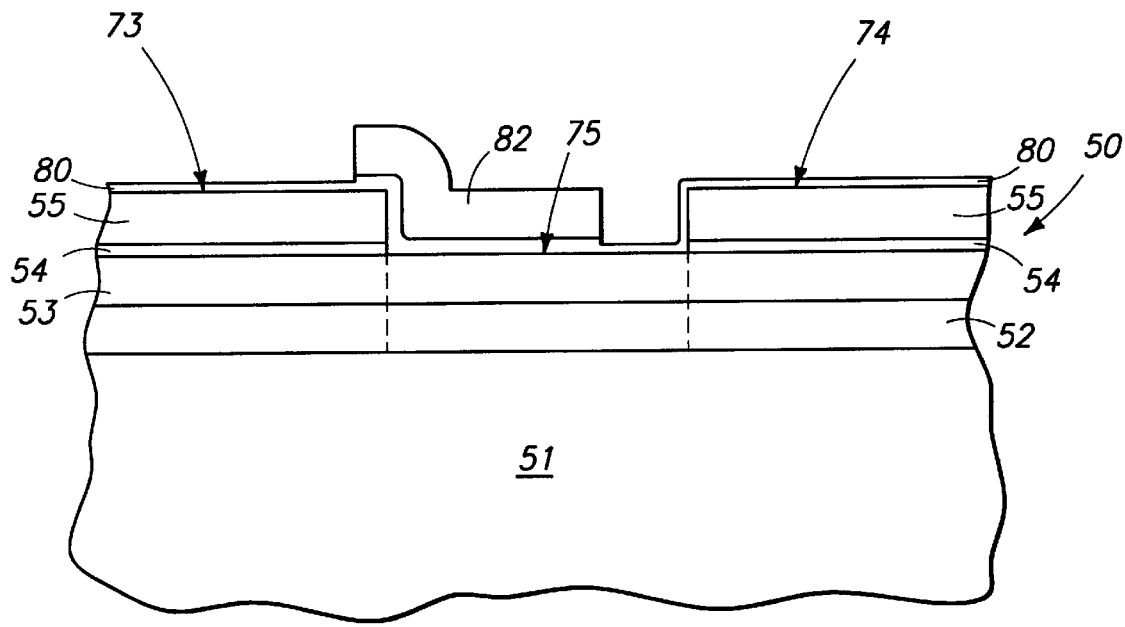
FIG. 8 is a cross sectional view of the FIG. 5 wafer taken at a processing step subsequent to that shown in FIG. 7.
Figure 9:
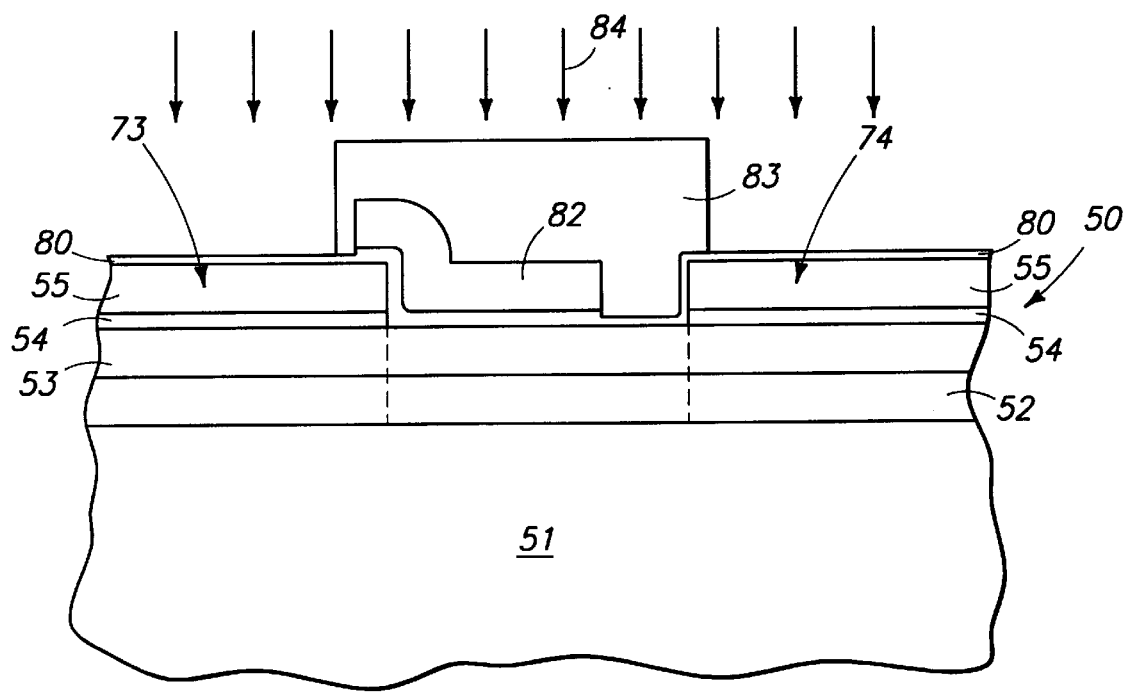
FIG. 9 is a cross sectional view of the FIG. 5 wafer taken at a processing step subsequent to that shown in FIG. 8.
Figure 10:
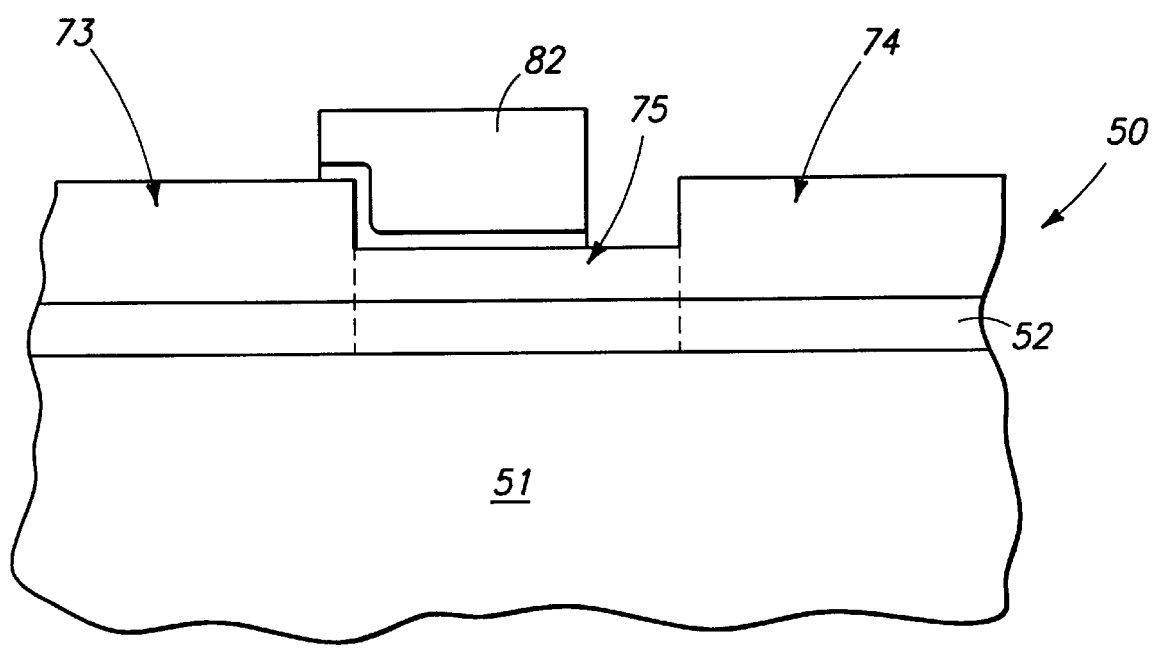
FIG. 10 is a cross sectional view of the FIG. 5 wafer taken at a processing step subsequent to that shown by FIG. 9.

As illustrated in FIG. 8, the method further comprises patterning and removing a portion of the gate layer 81 to form a gate 82 relative to the thin film channel region 75. Optionally, an implant may take place following the formation of the gate to define a lightly doped offset region in the thin film channel region (not shown). Further, and as illustrated in FIG. 9, a second masking layer 83 is disposed in covering relation relative to the gate 82, while leaving the source and drain regions 73 and 74, respectively, effectively exposed. This is an optional step if offset is required following the earlier step of gate patterning. The method further comprises subjecting the exposed source and drain region 73 and 74 to ion implanting represented by arrows 84 effective to conductively dope the source and drain regions and to disperse the etch stop layer 54 within the source and drain regions. This is seen in FIG. 10.

It will be recognized by a study of the drawings that the source and drain regions of the first and second embodiments 10 and 50 have 8 a thickness dimension greater than the associated thin film channel regions 35 and 75. Further, the step of ion implanting 41 and 84 for both forms of the invention 10 and 50 comprises utilizing an implant energy to provide a peak implant concentration at a depth near the etch stop layers 21 and 54. This has the greatest effect in dispersing the etch stop layers within the respective source and drain regions.

The operation of the described embodiments of the present invention are believed to be readily apparent and is briefly summarized at this point. One aspect of the present invention relates to a method for forming a thin film field effect transistor on a substrate comprising the following steps:

providing a substrate 11 having a gate and gate dielectric layers 13 and 14 formed thereon;

forming a thin film composite layer 23 proximate to the gate and gate dielectric layers 13 and 14, the thin film composite layer comprising a first layer of a semiconductor material 20, an etch stop layer 21 formed over the first layer of the semiconductor material, and a second layer of a semiconductor material 22 formed over the etch stop layer 21;

defining thin film source and drain regions 33 and 34 and an intermediate channel region 35 in the thin film composite layer 23;

forming a masking layer 30 over the source and drain regions 33 and 34 while leaving the thin film channel region 35 effectively exposed; and removing a portion of the second layer of semiconductor material selectively relative to the etch stop layer 21 in the area of the exposed channel region 35.

In accordance with another aspect of the invention, the method for forming a thin film field effect transistor on a substrate comprises:

providing a substrate 11 having a patterned gate 13 formed thereon;

forming a gate dielectric layer 14 over the patterned gate 13;

forming a thin film transistor layer 23 over the gate dielectric layer 14, the thin film transistor layer 23 comprising a composite of a first layer of a semiconductor material 20 formed over the gate dielectric layer 14, an etch stop layer 21 formed over the first layer of semiconductor material 20, and a second layer of a semiconductor material 22 formed over the etch stop layer 21;

forming a first masking layer 30 over the thin film transistor layer 23 to define a masked region 31 and an unmasked region 32, the masked region 31 comprising source and drain regions 33 and 34, and the unmasked region 32 comprising a channel region 35;

removing a portion of the unmasked second layer of semiconductor material substantially selective relative to the etch stop layer 21;

forming a second masking layer 40 over the channel region 35 while leaving the source and drain regions 33 and 34 effectively exposed; and subjecting the exposed source and drain regions 33 and 34 to ion implantation 41 effective to conductively dope the source and drain regions 33 and 34 and to disperse the etch stop layer 21 within the source and drain regions.

Still a further aspect of the present invention is to provide a method for forming a thin film field effect transistor on a substrate, comprising:

providing a substrate 51 having an insulating dielectric layer 52 formed thereon;

forming a thin film transistor layer 60 over the insulating dielectric layer 52, the thin film transistor layer 60 comprising a composite of a first layer of a semiconductor material 53 formed over the insulating dielectric layer 52, an etch stop layer 54 formed over the first layer of semiconductor material 53, and a second layer of a semiconductor material 55 formed over the etch stop layer 54;

forming a first masking layer 70 over the second layer of semiconductor material 55 to define a masked region 71 and an unmasked region 72 of the thin film transistor layer 60, the masked region 71 comprising source and drain regions 73 and 74, and the unmasked region 72 comprising a channel region 75;

removing a portion of the unmasked second layer of semiconductor material 55 selectively with respect to the etch stop layer 54;

forming a gate dielectric layer 80 over the thin film channel region 75;

forming a gate layer 81 over the gate dielectric layer 80;

patterning and removing a portion of the gate layer 81 to form a gate 82 proximate the thin film channel region;

forming a second masking layer 83 in covering relation with respect to the gate 82 while leaving the source and drain regions 73 and 74 effectively exposed; and subjecting the exposed source and drain regions 73 and 74 to ion implantation 84 effective to dope the source and drain regions 73 and 74 and to disperse the etch stop layer 54 within the source and drain regions 73 and 74.

Optionally, the method of the present invention includes an intermediate step wherein a lightly doped offset region is formed in the thin film channel region.

In compliance with the statute, the invention has been described in language which is more or less specific as to structural and methodical features. It is to be understood, however, that the invention is not limited to specific features shown and described since the means herein disclosed comprise preferred forms of putting the invention into effect. The invention is, therefore, claimed in any of its forms or modifications within the proper scope with the appended claims appropriately interpreted in accordance with the Doctrine of Equivalents.

What is claimed is:

1. A method of forming a thin film transistor on a substrate comprising:

providing a substrate having a gate;

forming a thin film composite layer proximate the gate, the thin film composite layer having an etch stop layer; and forming source and drain regions in the thin film composite layer by ion implantation which is effective to conductively dope the source and drain regions and to disperse the etch stop layer within the source and drain regions.

2. A method as claimed in claim 1, wherein the gate further comprises a gate dielectric layer, and wherein the thin film composite layer further comprises a first layer of a semiconductor material, and a second layer of semiconductor material, and wherein the etch stop layer is positioned between the first and second layers of semiconductor material.

3. A method as claimed in claim 1, and further comprising:

defining source and drain regions and an intermediate channel region in the thin film composite layer.

4. A method as claimed in claim 1, and further comprising:

defining source and drain regions and a thin film channel region;

after defining the thin film source and drain regions and the thin film channel region, forming a masking layer over the source and drain regions while leaving the thin film channel region effectively exposed; and removing a portion of the thin film composite layer selectively relative to the etch stop layer in the area of the exposed thin film channel region.

5. A method as claimed in claim 1, wherein the thin film transistor is top-gated.

6. A method as claimed in claim 1, wherein the thin film transistor is bottom-gated.

7. A method as claimed in claim 1, and further comprising:

forming a thin film channel region in the thin film composite layer; and after the step of forming the thin film channel region, forming a lightly doped offset region in the thin film composite layer.

8. A method as claimed in claim 1, and further comprising:

defining source and drain regions, and a thin film channel region in the thin film composite layer, and wherein the source and drain regions have a thickness greater than the thin film channel region.

9. A method for forming a thin film transistor comprising:

providing a substrate having an insulating dielectric layer formed thereon;

forming a thin film transistor layer over the insulating dielectric layer, the thin film transistor layer comprising a composite of first and second semiconductor material layers, and an etch stop layer positioned between the first and second semiconductor material layers, and wherein the first and second semiconductor material layers are the same material and provided to the same thickness and doping characteristics;

forming a first masking layer over the second layer of semiconductor material to define a masked region and an unmasked region of the thin film transistor layer, the masked region comprising source and drain regions, and the unmasked region comprising a thin film channel region, and wherein the source and drain regions have a thickness dimension greater than the thin film channel region;

removing a portion of the unmasked second layer of semiconductor material substantially selectively with respect to the etch stop layer;

forming a gate dielectric layer over the thin film channel region;

forming a gate layer comprising polysilicon having a thickness of about 3000 Angstroms over the gate dielectric layer;

patterning and removing a portion of the gate layer to form a gate proximate the thin film channel region;

after forming the gate, providing a lightly doped offset region in the thin film channel region;

forming a second masking layer in covering relation with respect to the gate while leaving the source and drain regions effectively exposed; and subjecting the exposed source and drain regions to ion implantation effective to dope the source and drain regions and to disperse the etch stop layer within the source and drain regions.

* * * * *

UNITED STATES PATENT AND TRADEMARK OFFICE
CERTIFICATE OF CORRECTION

PATENT NO : 6,066,517
DATED : May 23, 2000
INVENTOR(S) : Shubneesh Batra et al.

It is certified that error appears in the above-identified patent and that said Letters Patent are hereby corrected as shown below:

Col. 1, line 46
replace "polycrystauline"
with --polycrystalline--.

Signed and Sealed this

Tenth Day of April, 2001

*Attest:*

NICHOLAS P. GODICI

*Attesting Officer*    *Acting Director of the United States Patent and Trademark Office*

UNITED STATES PATENT AND TRADEMARK OFFICE
CERTIFICATE OF CORRECTION

PATENT NO.   : 6,066,517
DATED        : May 23, 2000
INVENTOR(S)  : Shubneesh Batra et al.

It is certified that error appears in the above-identified patent and that said Letters Patent is hereby corrected as shown below:

Column 1,
Line 4, add the following:
-- GOVERNMENT RIGHTS

This invention was made with the United States Government support under contract No.: MDA972-92-C-0054 awarded by the Advanced Research Projects Agency (ARPA). The United States Government has certain rights in this invention. --

Signed and Sealed this

Nineteenth Day of March, 2002

Attest:

JAMES E. ROGAN
*Director of the United States Patent and Trademark Office*

*Attesting Officer*